(12) United States Patent
Sakai et al.

(10) Patent No.: US 12,103,246 B2
(45) Date of Patent: Oct. 1, 2024

(54) METHOD OF BONDING SUBSTRATES, MICROCHIP AND METHOD OF MANUFACTURING THE SAME

(71) Applicant: USHIO DENKI KABUSHIKI KAISHA, Tokyo (JP)

(72) Inventors: Motohiro Sakai, Tokyo (JP); Shinji Suzuki, Tokyo (JP); Fumitoshi Takemoto, Tokyo (JP); Kenichi Hirose, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 778 days.

(21) Appl. No.: 15/814,267

(22) Filed: Nov. 15, 2017

(65) Prior Publication Data

US 2018/0141280 A1 May 24, 2018

(30) Foreign Application Priority Data

Nov. 21, 2016 (JP) .................. 2016-225765

(51) Int. Cl.
*B29C 65/74* (2006.01)
*B29C 35/08* (2006.01)
(Continued)

(52) U.S. Cl.
CPC .......... *B29C 65/7415* (2013.01); *B29C 59/14* (2013.01); *B29C 59/16* (2013.01);
(Continued)

(58) Field of Classification Search
CPC ..... B29C 65/7415; B29C 59/14; B29C 59/16; B29C 65/1406; B29C 65/1432;
(Continued)

(56) References Cited

U.S. PATENT DOCUMENTS 7,226,564 B2 6/2007 Ono
8,105,551 B2 * 1/2012 Park ...................... B29C 66/114
422/502

(Continued)

FOREIGN PATENT DOCUMENTS

JP 2004-136637 A 5/2004
JP 2004-325158 A 11/2004
(Continued)

OTHER PUBLICATIONS

Duffy et al., Rapid Prototyping of Microfluidic Systems in Poly(dimethylsiloxane), Anal. Chem., vol. 70, No. 23, Dec. 1998. (Year: 1998).*

(Continued)

*Primary Examiner* — Christopher W Raimund
(74) *Attorney, Agent, or Firm* — Studebaker & Brackett PC

(57) ABSTRACT

Disclosed herein is a method of bonding substrates, a microchip, and a method of manufacturing the microchip capable of joining two substrates in a higher adhered state even when at least one of the substrate has a warpage or a roll. A method of bonding a first substrate and a second substrate each of which is made of glass or a resin comprises: a surface activating step for activating each of joining surfaces of the first substrate and the second substrate; and a pressurizing step for pressurizing the first substrate and the second substrate in a state that the first substrate and the second substrate are stacked such that respective joining surfaces contact each other. The joining surface of the first substrate and/or the joining surface of the second substrate are constituted with a plurality of joining regions segmented to be separate from one another by a segmenting recessed portion.

10 Claims, 11 Drawing Sheets

(51) Int. Cl.

| | |
|---|---|
| *B29C 59/14* | (2006.01) |
| *B29C 59/16* | (2006.01) |
| *B29C 65/00* | (2006.01) |
| *B29C 65/02* | (2006.01) |
| *B29C 65/14* | (2006.01) |
| *B29L 11/00* | (2006.01) |
| *B29L 31/00* | (2006.01) |
| *B81C 3/00* | (2006.01) |
| *C09J 5/02* | (2006.01) |
| *H01L 21/18* | (2006.01) |
| *H01L 21/20* | (2006.01) |
| *H01L 21/67* | (2006.01) |

(52) U.S. Cl.
CPC ...... *B29C 65/1406* (2013.01); *B29C 65/1432* (2013.01); *B29C 66/028* (2013.01); *B29C 66/1122* (2013.01); *B29C 66/53461* (2013.01); *B29C 66/54* (2013.01); *B29C 66/83221* (2013.01); *B81C 3/001* (2013.01); *C09J 5/02* (2013.01); *H01L 21/187* (2013.01); *H01L 21/2007* (2013.01); *H01L 21/67005* (2013.01); *B29C 2035/0827* (2013.01); *B29C 65/02* (2013.01); *B29C 66/232* (2013.01); *B29C 66/30223* (2013.01); *B29C 66/534* (2013.01); *B29C 66/71* (2013.01); *B29C 66/712* (2013.01); *B29C 66/73366* (2013.01); *B29C 66/7465* (2013.01); *B29C 66/919* (2013.01); *B29C 66/92445* (2013.01); *B29C 66/929* (2013.01); *B29C 66/949* (2013.01); *B29L 2011/00* (2013.01); *B29L 2011/0016* (2013.01); *B29L 2031/756* (2013.01); *C09J 2400/143* (2013.01); *C09J 2400/146* (2013.01); *C09J 2400/163* (2013.01); *C09J 2400/166* (2013.01)

(58) Field of Classification Search
CPC ............... B29C 66/028; B29C 66/1122; B29C 66/53461; B29C 66/54; B29C 66/83221; B29C 65/02; B29C 66/232; B29C 66/30223; B29C 66/534; B29C 66/71; B29C 66/712; B29C 66/73366; B29C 66/7465; B29C 66/919; B29C 66/92445; B29C 66/929; B29C 66/949; B29C 2035/0827; B81C 3/001; C09J 5/02; C09J 2400/143; C09J 2400/146; C09J 2400/163; C09J 2400/166; H01L 21/187; H01L 21/2007; H01L 21/67005; B29L 2011/00; B29L 2011/0016; B29L 2031/756
USPC ...................................................... 156/272.2
See application file for complete search history.

(56) References Cited

U.S. PATENT DOCUMENTS

| | | | |
|---|---|---|---|
| 10,286,640 | B2 | 5/2019 | Wasamoto et al. |
| 2004/0211511 | A1 | 10/2004 | Suzuki |
| 2009/0214856 | A1 | 8/2009 | Gomi |
| 2010/0216228 | A1* | 8/2010 | Love ..................... B01L 3/5085 435/288.7 |
| 2012/0321536 | A1* | 12/2012 | Kokini ................ B29C 66/7394 422/502 |
| 2014/0027054 | A1 | 1/2014 | Yoshihara et al. |
| 2015/0239217 | A1 | 8/2015 | Watanabe et al. |
| 2017/0297019 | A1* | 10/2017 | Wan ..................... B29C 65/4895 |

FOREIGN PATENT DOCUMENTS

| | | |
|---|---|---|
| JP | 3714338 B2 | 11/2005 |
| JP | 2006-187730 A | 7/2006 |
| JP | 2008-019348 A | 1/2008 |
| JP | 2009-197169 A | 9/2009 |
| JP | 2012-223858 A | 11/2012 |
| JP | 5152361 A | 2/2013 |
| WO | 2008/087800 A1 | 7/2008 |
| WO | 2014-010299 A1 | 1/2014 |
| WO | 2016-147828 A1 | 9/2016 |

OTHER PUBLICATIONS

An Office Action; "Decision of Refusal" issued by the Japanese Patent Office on Dec. 12, 2018, which corresponds to Japanese Patent Application No. 2016-225765 and is related to U.S. Appl. No. 15/814,267; with English language translation.

An Office Action; "Notification of Reasons for Refusal," issued by the Japanese Patent Office on Sep. 27, 2018, which corresponds to Japanese Patent Application No. 2016-225765 and is related to U.S. Appl. No. 15/814,267; with English language translation.

An Office Action; "Notification of Reasons for Refusal," issued by the Japanese Patent Office on Jul. 20, 2018, which corresponds to Japanese Patent Application No. 2016-225765 and is related to U.S. Appl. No. 15/814,267; with English language translation.

* cited by examiner

METHOD OF BONDING SUBSTRATES, MICROCHIP AND METHOD OF MANUFACTURING THE SAME

FIELD OF THE INVENTION

The present invention relates to a method of bonding two substrates, a microchip and a method of manufacturing the microchip.

DESCRIPTION OF THE RELATED ART

Recent years, in a field of biochemistry, a certain technique that uses a microreactor for separating, synthesizing, extracting or analyzing a slight amount of reagent has been drawing an attention. This kind of microreactor is constituted with a microchip in which an analytical channel in microscale or the like is formed by use of a semiconductor micro fabrication technique on a small substrate made of, for example, silicon, silicon resin, or glass or the like.

A reaction analysis system using this kind of microreactor is called a Micro Total Analysis System (hereinafter referred to as "μTAS"). By using the μTAS, it makes it possible to perform the reaction analysis at a high speed with a high accuracy due to the fact that the ratio of a surface area thereof with respect to the volume of the reagent becomes larger. Also, it makes it possible to accomplish a compact and automated reaction analysis system.

In terms of the microchip, a microchip suitable for various use applications can be constituted by providing a functional region having various functions, such as a reactive region on which the reagent is arranged or the like, in a flow channel, which is referred to as a "microchannel".

Non exhaustive list of those use applications of the microchip may include an analysis in a chemical, biochemical, pharmacy, medicine, or veterinary medicine field, such as a gene analysis, a clinical diagnosis, and a drug screening and the like, a compound synthesis, and an environmental measurement and the like.

This kind of microchip is typically formed with a pair or microchip substrates being opposed and joined to each other. On a surface of at least one of the microchip substrates, a minute or microscopic flow channel having, for example, a width of 10 μm to hundreds of μm and a depth of 10 μm to hundreds of μm is formed. As a material of the microchip substrate, currently a glass substrate is largely used as capable of being easily manufactured and also capable of an optical detection.

Also, most recently, a development of a microchip using a synthetic resin substrate has been pursued as the synthetic resin substrate is inexpensive and less likely to be damaged as compared to the glass substrate while being light weighted.

For manufacturing the microchip, as a method of joining two microchip substrates, a method of adhering by use of an adhesive agent or a method using a thermal fusion bonding or the like can be conceived.

However, those methods may entail the following problems. That is to say, in the method of joining by use of the adhesive agent, it is likely that the adhesive agent may seep into a microchannel to occlude the flow channel, a part of the microchannel may become narrower to cause the diameter of the flow channel to be uneven, and further an undesired turbulence may occur in the characteristic, which should be inherently homogeneous, on a wall surface of the flow channel.

On the other hand, in the method of joining by the thermal fusion bonding, the high functionality of the microchip is hardly achieved because the flow channel may collapse during a heating phase and the flow channel may fail to be kept in a desired cross-sectional shape when being fusion-bonded at a temperature above the heating melt temperature.

To cope with the above mentioned problems, certain methods have been proposed in which joining surfaces of the respective substrates are activated, and the two substrates are stacked and joined to each other such that the respective joining surfaces thereof contact each other (as disclosed in, for example, Patent Literatures 1 to 5). According to those disclosures, the joining surfaces of the respective substrates are activated by, for example, irradiating respective joining surfaces of the two substrates with vacuum ultra violet light, or alternatively by making a process gas into plasma at an atmospheric pressure or a pressure in the vicinity thereof and causing the process gas made into plasma to contact the surfaces of the substrates.

Also, another method has been proposed in which two substrates are joined to each other by inserting a conjunctive or combining film between the two substrates and irradiating the conjunctive film with the ultra violet light to allow the conjunctive film to express the adhesiveness (as disclosed in, for example, Patent Literature 6).

LISTING OF REFERENCES

Patent Literature

Patent Literature 1: Japanese Patent Publication No. 3714338 B

Patent Literature 2: Laid-open Publication of Japanese Patent Application No. 2006-187730 A Patent Literature 3: Laid-open Publication of Japanese Patent Application No. 2008-19348 A Patent Literature 4: International Publication of PCT Application No. WO 2008/087800 A1

Patent Literature 5: Japanese Patent Publication No. 5152361 B

Patent Literature 6: Laid-open Publication of Japanese Patent Application No. 2009-197169 A

SUMMARY OF THE INVENTION

Problems to be Solved by the Invention

In the meantime, recent years, a certain microchip that is adaptable to various measurements, such as a simultaneous measurements of a plurality of specimens or numerous measurements in which measurement methods differ from one another, has been pursued.

In order to achieve this kind of microchip, it is required to incorporate a plurality of measurement detection units into one microchip or to constitute various measurement structures corresponding to a plurality of measurement methods in the measurement detection unit. As a result, one piece of microchip becomes larger in size inevitably.

A large sized microchip has, for example, the length and breadth of approximately 85 mm×128 mm. The two microchip substrates constituting the microchip have, for example, the thickness equal to or greater than several mm, respectively.

However, the above mentioned large sized microchip may entail the following problems.

As mentioned above, the microchip typically has a structure in which a pair of (i.e., two) microchip substrates are opposed and joined to each other. In the large sized microchip, inter alia, the size of the pair of the microchip substrates themselves becomes larger as a matter of course. As such, the joining state or condition of the pair of the microchip substrates is more likely affected by a roll on the joining surface, which each microchip substrate inevitably has, or a warpage of the microchip substrate itself or the like.

In other words, in some cases, a whole surface area of the joining surface is not necessarily adhered tightly when a pair of the microchip substrates are stacked on each other due to the roll on the joining surface of the microchip substrate or the warpage of the microchip substrate itself.

FIGS. 12A to 12E are views schematically illustrating an example of a conventional method of manufacturing a microchip.

Referring to FIGS. 12A to 12E, a method of manufacturing a microchip by joining a first microchip substrate 51 to a second microchip substrate 55 having a flat plate shape will be described more particularly. The first microchip substrate 51 is provided with an injection port 62 consisting of a through hole, a discharge port 63 consisting of a through hole for discharging the reagent or the like, and a flow channel forming portion 64 having a gutter (cullis or watershoot) shape and allowing the through hole of the injection port 62 to communicate with the through hole of the discharge port 63.

First, vacuum ultra violet light L emitted from an ultra violet light source 59 is radiated onto each of a joining surface 51a of the first microchip substrate 51 and a joining surface 55a of the second microchip substrate 55 (as shown in FIGS. 12A and 12B). Referring to FIG. 12A, it is assumed that a roll is generated on the joining surface 51a of the first microchip substrate 51 (shown as a portion surrounded by a dashed line in FIG. 12A).

Subsequently, the first microchip substrate 51 is stacked onto the second microchip substrate 55 such that the joining surface 51a of the first microchip substrate 51 contacts the joining surface 55a of the second microchip substrate 55. In a stacked body 50 obtained, a space S is slightly formed at a position having a roll on the joining surface 51a of the first microchip substrate 51 (as shown in FIG. 12C).

Yet subsequently, the stacked body 50 is pressurized and heated (as shown in FIG. 12D). Resultantly, a joined body or assembly (or junction body) 57 is obtained by pressurizing and heating in this way.

It is assumed that the roll on the joining surface is generated as being exemplarily described in the followings. For example, in the case in which the microchip substrate is a resin substrate, the substrate itself is mostly manufactured by an injection molding.

In the injection molding, the resin, which is heated to obtain the fluidity, is casted into a mold, then cooled and solidified. During this process, in general, when the resin is cooled, the volume of the resin contracts so that recesses, so-called sink marks or shrink marks, are generated in a molded product item in some cases.

Also, although the heated resin has a higher fluidity, in the case in which the mold has a complicated shape, in some cases a streaky pattern, so-called weld line, is formed at a position the sneaking resin re-associates with the other sneaking resin after being cooled slightly. Under those circumstances, a localized irregularity, which is not a minute irregularity called surface roughness but a large irregularity called roll, is generated on the joining surface.

In general, in the injection molding of the resin material, it is highly likely that a recess of approximately 50 to 100 µm is generated in the molded product item. On the other hand, the height of the minute flow channel (that is, a microchannel) formed in the microchip substrate 51 in the joining direction (that is, the length of the flow channel forming portion 64 in the vertical direction in FIGS. 12A to 12E) is, for example, approximately 50 to 200 µm. If this height considerably varies, it is undesirable because the flow rate or the reaction rate of a specimen circulated in the microchannel is adversely deviated from a desired design value. Generally speaking, the margin of error from a desired design value is required to be within ±10%.

In the joined body 57 obtained by the method of manufacturing the microchip shown in FIGS. 12A to 12E, when the joining surface 51a, on which the flow channel forming portion 64 having the height of, for example, 200 µm is formed, is pressed so as to repair (or correct) the recess of 50 µm inevitably formed on the joining surface 51a in the pressing step shown in FIG. 12D in order to cause the space S to disappear, then the height in the joining direction already comes to be displaced by 25% at that moment.

On the other hand, when the pressing force becomes smaller in order to suppress the deformation of the flow channel forming portion 64 to a smaller amount, then the above mentioned space S does not disappear to be remain as a defective portion in the joining as shown in FIG. 12E. By applying the heat during the pressing step, both joining surfaces being pressed fit in each other at a joining boundary to some extent. However, it is likely to entail the deformation of the microchannel by heating.

Accordingly, when the recess at the above mentioned level is formed on the microchip substrate, it is difficult to suppress the microchannel from being deformed while achieving the space S to disappear.

As mentioned above, not limited to just the microchip substrate, as a substrate to be joined becomes larger, various problems are likely to be entailed due to the roll on the to-be-bonded surface of the substrate or the warpage of the substrate itself. For example, the defective portion in joining the substrates may occur, the minute flow channel formed in the substrate may deform, and gas bubbles or the like may be caught in the joining boundary between the two substrates.

In addition, when two substrates are bonded in a state in which the to-be-bonded surface of the substrate has the roll or the substrate itself has the warpage, the stress concentration may occur at a portion of the joined body due to the above mentioned roll or the warpage. For this reason, in some cases, the stress concentration may entail the problem that at least a partial region of the substrate, which has been once joined, may peel off.

Yet in addition, when the gas bubbles are caught in the joining boundary in the joined body, in some cases the gas bubbles may cause a noise which adversely affects an optical measurement.

Due to the above mentioned problems, as the case stands now, it is difficult to manufacture a microchip having a relatively large size. For this reason, it makes it difficult to incorporate a plurality of measurement detection units into one microchip or to constitute the various measurement structures corresponding to a plurality of measurement methods in the measurement detection unit.

It should be noted that, when the thickness of the microchip substrate is thin, for example, approximately 10 µm, then it is possible to improve the adhesiveness at the joining boundary between the two microchip substrates because the flexibility of the microchip substrate becomes higher. However, it is still difficult to choose this kind of method because the thickness of an individual microchip substrate becomes equal to or greater than several mm when manufacturing a large sized microchip.

The present invention has been made in view of the above mentioned circumstances and an object thereof is to provide a method of bonding substrates, a microchip, and a method of manufacturing a microchip that are capable of joining two substrates in a higher adhered state even when at least one of the substrates has a warpage of the substrate or a roll on a joining surface of the substrate.

Solution to the Problem

In order to solve the above mentioned problems, according to one aspect of the present embodiments of the present invention, there is provided a method of bonding a first substrate and a second substrate each of which is made of glass or a resin. The method comprises: a surface activating step for activating each of a joining surface of the first substrate and a joining surface of the second substrate; and a pressurizing step for pressurizing the first substrate and the second substrate in a state that the first substrate and the second substrate are stacked such that respective joining surfaces contact each other. The joining surface of the first substrate and/or the joining surface of the second substrate are constituted with a plurality of joining regions segmented to be separate from one another by a segmenting recessed portion.

In the method of bonding the substrates according to one embodiment, preferably, where t denotes a thickness of the substrate having the segmenting recessed portion, d denotes an upper limit of a depth of the segmenting recessed portion from the joining surface, and $d_{min}$ denotes a lower limit of the depth d of the segmenting recessed portion from the joining surface, $d_{min}$ may be greater than 50 μm and may satisfy a following formula (1):

$$0.7t \geq d \geq d_{min} \geq 0.05t.$$

Furthermore, in the above mentioned method of bonding the substrates, preferably, the segmenting recessed portion may be constituted with a groove, and where w denotes a width of the groove, w may satisfy a following formula (2):

$$w \geq t.$$

Yet furthermore, in the above mentioned method of bonding the substrates, preferably, the surface activating step may include an ultra violet light irradiation step for irradiating each of the joining surface of the first substrate and the joining surface of the second substrate with vacuum ultra violet light.

Yet furthermore, in the above mentioned method of bonding the substrates, preferably, the surface activating step may include a plasma gas processing step for causing a process gas made into plasma by an atmospheric pressure plasma to contact each of the joining surface of the first substrate and the joining surface of the second substrate.

According to another aspect of the present embodiments of the present invention, there is provided a method of manufacturing a microchip having a flow channel in which a medium flows. The microchip is provided with a flow channel forming portion on at least one of joining surfaces of a first substrate and a second substrate each of which is made of glass or a resin. The microchip is obtained by joining the first substrate and the second substrate using the above described method of bonding the substrates.

According to yet another aspect of the present embodiments of the present invention, there is provided a microchip having a flow channel in which a medium flows. The microchip comprises: a first substrate and a second substrate bonded to each other and each of which is made of glass or a resin; and a flow channel forming portion provided on at least one of a joining surface of the first substrate and a joining surface of the second substrate. The joining surface of the first substrate and/or the joining surface of the second substrate are constituted with a plurality of joining regions segmented to be separate from one another by a segmenting recessed portion.

Advantageous Effect of the Invention

According to the above mentioned aspects of the method of bonding the substrates of the various embodiments, the joining surface of the first substrate and/or the joining surface of the second substrate are constituted with a plurality of joining regions segmented to be separate from one another by a segmenting recessed portion. As an area of an individual joining region is sufficiently smaller as compared to the case in which a whole surface of the substrate constitutes one joining surface, it makes it possible to suppress a warpage of the substrate or a roll on the joining surface thereof from adversely affecting. Thus, when the substrates are pressurized in the pressurizing step, in each of the joining regions, a whole surface thereof is capable of being adhered tightly in an assured manner.

As a result, it makes it possible to make the whole surfaces of the joining boundary in the joined body are tightly adhered to each other in an assured manner. Resultantly, it makes it possible to join the first substrate to the second substrate in a higher adhered state even when at least one of the substrates has a warpage of the substrate or a roll of the joining surface thereof.

Furthermore, according to the above mentioned aspects of the method of manufacturing a microchip of the various embodiments, the first substrate and the second substrate are joined to each other according to the above mentioned aspect of the method of bonding the substrates, it makes it possible to make the whole surfaces of the joining boundary of the microchip obtained are tightly adhered to each other in an assured manner.

Resultantly, it makes it possible to join the first substrate and the second substrate in a higher adhered state even when at least one of the substrate has a warpage of the substrate or a roll on the joining surface thereof. As a result, it makes it possible to form a desired flow channel even in a large sized microchip with a higher reliability.

These and other objects, aspects and advantages of the present invention will become apparent to those skilled in the art from the following detailed description when read and understood in conjunction with the appended claims and drawings.

DETAILED DESCRIPTION OF THE INVENTION

Hereinafter, embodiments of the present invention will be explained in detail with reference to accompanying drawings.

(Method of Bonding Substrates)

Figure 2:
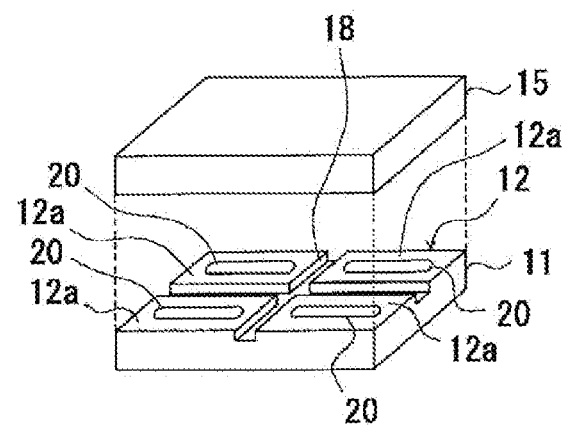
FIG. 2 is a perspective view illustrating an exemplary configuration of a first substrate and a second substrate.
Figure 3:
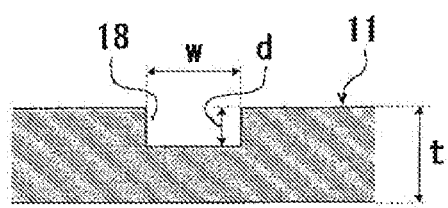
FIG. 3 is a cross-sectional view of an exemplary configuration of the first substrate with a segmenting recessed portion being enlarged.

FIGS. 1A to 1E are views schematically illustrating an example of a method of bonding substrates according to the present embodiment. FIG. 2 is a perspective view illustrating an exemplary configuration of a first substrate and a second substrate. FIG. 3 is a cross-sectional view illustrating the first substrate with a segmenting recessed portion with the first substrate being enlarged.

Figure 1A:
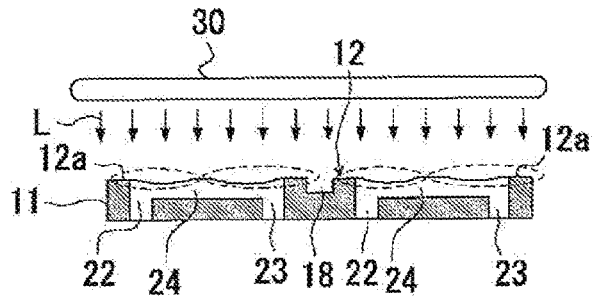
FIG. 1A is a view schematically illustrating an example of a method of bonding substrates according to a present embodiment of the present invention.
Figure 1B:
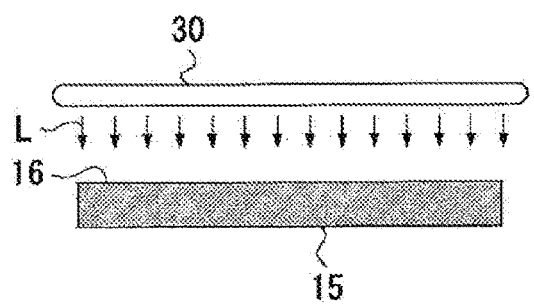
FIG. 1B is a view schematically illustrating the example of a method of bonding substrates according to a present embodiment of the present invention.
Figure 1C:
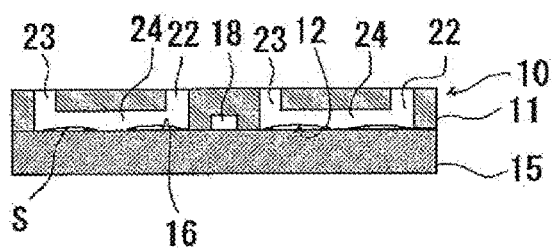
FIG. 1C is a view schematically illustrating the example of a method of bonding substrates according to a present embodiment of the present invention.
Figure 1D:
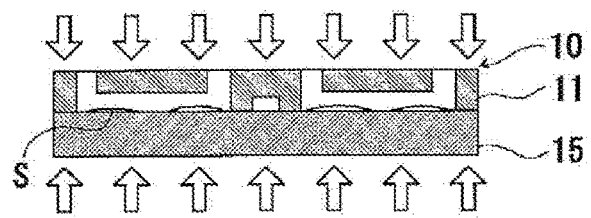
FIG. 1D is a view schematically illustrating the example of a method of bonding substrates according to a present embodiment of the present invention.

The method of bonding substrate according to the present embodiment includes a surface activating step for activating a joining surface 12 of a first substrate 11 and a joining surface 16 of a second substrate 15, respectively (as shown in FIGS. 1A and 1B), a stacking step for stacking the first substrate 11 onto the second substrate 15 such that the respective joining surfaces 12 and 16 contact each other to obtain a stacked body 10 (as shown in FIG. 1C), and a pressurizing step for pressurizing the stacked body 10 (as shown in FIG. 1D).

(Substrates or Base Material)

Hereinafter throughout the specification, the term "substrate" broadly includes a plate like shape and also a three dimensional shape and may be referred to as "base material". As a non-exhaustive example, a three dimensional substrate or base material may include an optical component such as a prism or a lens or the like.

The first substrate 11 and the second substrate 15, which is applicable to the present embodiment, are made of a material selected from a group consisting of glass and a synthetic resin, respectively.

As the synthetic resin constituting the substrates 11 and 15, a silicone resin, a cycloolefin resin (a cycloolefin polymer (COP) or a cycloolefin copolymer (COC) or the like), an acrylic resin, a polycarbonate resin, a styrene resin (polystyrene (PS)) or the like may be used. For example, when the substrates 11 and 15 are microchip substrates, it is preferable to employ a material having a sufficient light permeability. As a resin having a sufficient light permeability, for example, the acrylic resin or the cycloolefin resin may be used.

The substrates 11 and 15 may be made of the same type of material, such as the acrylic resin and the acrylic resin or the COP and the COP, or alternatively made of a material in which different types of resin are combined, such as the COP and the PS. When combining the different resin, it is preferable to make the substrate 11, in which the segmenting recessed portion is fabricated, from a soft or flexible material in hardness, because the segmenting recessed portion acquires a higher flexibility so that the substrate is more likely to tightly adhere.

As the glass constituting the substrates 11 and 15, quartz glass, alkali-free glass, borosilicate glass, soda lime glass or the like may be used.

The substrates 11 and 15 may be made of the same type of material, such as the quartz glass and quartz glass or the borosilicate glass and the borosilicate glass, or alternatively made of a material in which different types of glass are combined, such as the alkali-free glass and the borosilicate glass.

Yet alternatively, the synthetic resin and the glass may be combined, such as the silicone resin and either the quartz glass or the alkali-free glass.

According to the present embodiment, the joining surface 12 of the first substrate 11 and/or the joining surface 16 of the second substrate 15 are constituted with a plurality of joining regions that are segmented or partitioned by a segmenting recessed portion consisting of a groove 18 (hereinafter also referred to as "segmenting groove") so that each of the joining regions is separated from other joining regions.

The joining surface 12 of the first substrate 11 and the joining surface 16 of the second substrate 15 each contains a functional region. The functional region means, for example, a region on which a structural recess 20 (as shown in FIG. 2), which constitutes a flow channel called "microchannel" or the like, is formed, or a region that seals the structural recess 20 formed on the opposing substrate.

Hereinafter, it is assumed that the first substrate 11 and the second substrate 15 are microchip substrates, respectively. Also, it is assumed that the joining surface 12 of the first substrate 11 is solely constituted with joining regions 12a each segmented by the segmenting groove 18, and the structural recess 20 is formed on each of the joining regions 12a constituting the joining surface 12. Yet also, it is assumed that the joining surface 16 of the second substrate 15 is shaped to be one continuous flat surface.

It is preferable that respective joining regions 12a constituting the joining surface 12 of the first substrate 11 are positioned on a substantially same plane.

More particularly, the structural recess 20 formed on each of the joining region 12a of the first substrate 11 includes an injection port 22, a discharge port 23, and a flow channel forming portion 24. The injection port 22 is constituted with a through hole configured to inject, for example, the reagent or the like shown in FIGS. 1A to 1E. The discharge port 23 is constituted with a through hole configured to discharge the reagent or the like.

The flow channel forming portion 24 allows the through hole of the injection port 22 to communicate with the through hole of the discharge port 23 and has a gutter like shape and a cross section of, for example, rectangular or semicircular shape. This kind of structural recess 20, which requires those injection port 22, discharge port 23, and flow channel forming portion 24, may be formed by employing a known technique such as the machining or the mold transcription.

Although the structural recess is not formed on the second substrate 15 in FIG. 2, alternatively, a structural recess corresponding to the structural recess 20 of the first substrate 11 may be formed on, for example, the joining surface 16 of the second substrate 15.

The structural recess 20 and the segmenting groove 18 may be formed by, for example, injection molding a substrate having a flat plate shape.

On the first substrate 11 in an example of FIGS. 1A to 1E and FIG. 2, four structural recesses 20, which serve as the measurement circuit units, respectively, are formed. However, the number of the structural recesses are not limited to four. By employing one piece of first substrate (microchip substrate) in which numerous structural recesses serving as numerous measurement circuit units are formed, it makes it possible to manufacture a large sized microchip that is capable of performing numerous functions.

The segmenting groove 18, which segments the joining surface 12 into the joining regions 12a, has a wall thickness smaller than that of the joining region 12a and serves as a non-contact portion that does not contact the opposing substrate when two substrates 11 and 15 are joined to each other. The segmenting groove 18 may be, for example, of a gutter like shape having a cross section of a rectangular, semicircular or a wedge shape, or a combination thereof.

Also, the segmenting groove 18 are arranged to be across the substrate (or base material) from one end of the substrate to the other end of the substrate so as to provide the higher flexibility to the substrate.

For example, the segmenting groove 18 in the example in FIGS. 1A to 1E and FIG. 2 has a shape in which two gutter shaped grooves, which extend in the longitudinal direction and the transverse direction of the first substrate 11, respectively, intersect with each other in a cross shape. In the illustrated example, on the joining surface 12, four joining regions 12a, each of which has a rectangular shape when viewed in a plan view, are aligned and arranged longitudinally and transversely in a matrix.

According to the method of bonding the substrates of the present embodiment, it is preferable that, where t denotes the thickness of the first substrate 11 having the segmenting groove 18, d denotes an upper limit of the depth of the segmenting groove 18 from the joining surface 12, and $d_{min}$ denotes a lower limit of the depth d of the segmenting groove 18 from the joining surface 12, $d_{min}$ has a value greater than 50 µm and satisfies the following formula (1).

$$0.7t \geq d \geq d_{min} > 0.05t \quad \text{formula (1)}$$

Furthermore, as shown in FIGS. 1A to 1E and FIG. 2, when the segmenting recessed portion is constituted with the segmenting groove 18, it is preferable that, where w denotes the width of the segmenting groove 18, in addition to the above mentioned formula (1), w satisfies the following formula (2).

$$w \geq t \quad \text{formula (2)}$$

With the above formulas (1) and (2) being satisfied, it makes it possible to tightly adhere the whole surfaces of the joining regions 12a to the joining surface 16 of the second substrate 15 in an assured manner with a smaller pressing force that is unlikely to cause the flow channel forming portion 24 to be excessively deformed, which is applied in the pressurizing step, which will be described later.

Furthermore, with the above formula (1) being satisfied, the flexibility becomes larger at a position in which the segmenting groove 18 is formed on the first substrate 11 while obtaining a sufficient mechanical strength. As a result, it makes it possible to tightly adhere the respective joining regions 12a to the joining surface 16 of the second substrate 15 in an assured manner with a smaller pressing force that corresponds to respective flatness in the pressurizing step.

In this regard, when the upper limit of the depth d of the segmenting groove 18 from the joining surface 12 is excessively large, in other words, the segmenting groove 18 is excessively deep, then the first substrate 11 fails to obtain the sufficient mechanical strength. On the other hand, when the lower limit of the depth $d_{min}$ of the segmenting groove 18 from the joining surface 12 is excessively small, in other words, the segmenting groove 18 is excessively shallow, then a portion of the first substrate 11 on which the segmenting groove 18 is formed fails to obtain the sufficient flexibility.

An area of the individual joining region 12*a* is required to have a size that does not interfere with the degree of freedom in the design of the structural recess 20, and determined depending on the maximum pressing force as far as the structural recess 20 does not deform excessively. In other words, when the pressing force is excessively large, then it entails an excessive deformation of the structural recess 20. This is because the pressing force to be applied in the pressurizing step is considered to be larger as the area of the joining region 12*a* becomes larger. For this reason, the area of the individual joining region 12*a* is determined to have a size that is capable of tightly adhering the whole surface thereof in an assured manner without entailing excessive deformation of the structural recess 20 in, in particular, the flow channel forming portion 24.

The pressing force that does not entail the excessive deformation of the structural recess 20 of the first substrate 11 is determined depending on the Young's modulus of a material constituting the first substrate 11 and the size of respective portions of the structural recess 20.

As an exemplary dimension of the substrates 11 and 15, each of the substrates 11 and 15 is sized in the length and breadth of, for example, 85 mm×128 mm. The thickness of the first substrate 11 is for example 2 to 5 mm, and the thickness of the second substrate 15 is for example 0.1 to 2 mm. Also, the width of the segmenting groove 18 is 2 mm, and the depth thereof is 1 to 2 mm. Also, each of the joining regions 12*a* is sized in the length and breadth of 85 mm×128 mm. Yet also, as an exemplary dimension of the flow channel forming portion 24 of the structural recess 20, the width thereof is 500 to 200 μm, the depth thereof is 50 to 200 μm, and the length thereof is 9 mm.

(Surface Activating Step)

It is preferable that the surface activating step is a ultraviolet light irradiation step for irradiating the joining surface 12 of the first substrate 11 and the joining surface 16 of the second substrate 15 with the vacuum ultra violet light L, respectively, or alternatively the surface activating step is a plasma gas processing step for causing a process gas made into plasma by an atmospheric pressure plasma to contact the joining surface of the first substrate and the joining surface of the second substrate, respectively. In FIGS. 1A to 1E, the ultra violet light irradiation step is illustrated to be performed.

(1) Ultra Violet Light Irradiation Step

When the ultra violet light irradiation step is employed as the surface activating step, the joining surfaces 12 and 16 of the substrate 11 and 15 are irradiated with the vacuum ultra violet light having wavelength equal to or less than 200 nm from a ultra violet light source 30, respectively.

As the ultra violet light source 30, for example, a xenon excimer lamp having a bright line at the wavelength of 172 nm, a low pressure mercury lamp having a bright line at the wavelength of 185 nm, or a deuterium lamp having a bright line at the wavelength within the range between 120 and 200 nm.

The illuminance of the vacuum ultra violet light L irradiated onto the joining surfaces 12 and 16 of the substrates 11 and 15 is, for example, 10 to 100 nW/cm$^2$.

Also, although the irradiation time of the vacuum ultra violet light L onto the joining surfaces 12 and 16 of the substrates 11 and 15 is to be set depending on a material constituting the substrates 11 and 15 as appropriate, the irradiation time is preferably, for example, equal to or greater than 5 seconds, and more preferably within the range between 10 to 60 seconds.

(2) Plasma Gas Processing Step

When the plasma gas processing step is employed as the surface activating step, a process gas made into plasma by an atmospheric pressure plasma is caused to contact the joining surfaces of the substrates.

As the process gas, it is preferable to use a gas composed mainly of a nitrogen gas, an argon gas or the like and contains 0.01 to 5 volume % of an oxygen gas. Alternatively, a mixed gas of the nitrogen gas and a clean dry air (CDA) may be used.

Also, the processing time for the plasma gas processing is, for example, 5 to 100 seconds.

By performing the surface activating processing to the substrate as described above, the joining surfaces 12 and 16 of the substrates 11 and 15 becomes the state that is appropriate to be joined to each other (in other words, the state in which a terminal thereof is substituted with a hydroxy group (OH group)).

(Stacking Step)

In the stacking step, as shown in FIG. 1C, the first substrate 11 and the second substrate 15 are stacked under a room temperature environment such that the joining surface 12 of the first substrate 11 and the joining surface 16 of the second substrate 15 contact each other.

With the first and second substrates undergoing the above mentioned stacking step, it makes it possible to obtain a stacked body 10 in the state in which the first substrate 11 and the second substrate 15 are stacked onto each other.

At this stage, it is assumed that a roll is generated on the joining surface 12 of the first substrate 11 (as shown as a portion enclosed by the chained line in FIG. 1A). For this reason, a space S is formed at a position having the roll on the joining surface 12 of the first substrate 11 in the stacked body 10 obtained.

It should be noted that, in the example shown in FIGS. 1A to 1E, although it is assumed that the roll is not generated on the second substrate 15, an advantageous effect of the present embodiment can be obtained even when the roll or the warpage is generated on the second substrate 15 as well.

(Pressurizing Step)

In the pressurizing step, the stacked body 10 obtained by the stacking step is pushed and pressurized in the direction approaching to each other so that the joining surface 12 of the first substrate 11 and the joining surface 16 of the second substrate 15 are tightly adhered to each other.

Pressurizing the stacked body 10 may be performed, for example, under a constant pressurizing condition, or alternatively, in a plurality of phases, for example, two phases, with the processing condition being adjusted as appropriate. In FIG. 1D, the pressing force to the stacked body 10 is illustrated with an outlined arrow.

The pressurizing condition may be set depending on a material constituting the substrate or the heating temperature or the like as appropriate.

More particularly, as exemplary pressurizing conditions, the pressurizing force is to be set to the magnitude that prevents the flow channel forming portion 24 from being excessively deformed, and in particular, for example, set to 0.1 to 5 MPa. The pressurizing time is set to, for example, 60 to 300 seconds. Also, when the pressurizing process to the substrate is performed in two separate phases, the pressurizing force in the second pressurizing process may be set to be smaller than the pressurizing force in the first pressurizing process within the above mentioned numerical range. Likewise, the pressurizing time in the second pressurizing process maybe set to be longer than the pressurizing time in the first pressurizing process within the above described numerical range.

During the pressurizing step, from the viewpoint to allow the joining to be strengthen, the stacked body 10 may be heated simultaneously with the pressurizing and/or after the pressurizing.

More particularly, as exemplary heating conditions, the heating temperature is set to, for example, 40 to 130 degrees Celsius, and the heating time is set to, for example, 60 to 300 seconds.

In the pressurizing step, as will be described below in detail, the joining surface 12 of the first substrate 11 tightly adheres to the joining surface 16 of the second substrate 15. In other words, the first substrate 11, on which a plurality of joining regions 12a are formed on the joining surface 12 in a state separated from one another by the segmenting groove 18, and the second substrate 15 are pushed and pressurized. Then, first, the joining regions 12a, which serve as convex portions in the first substrate 11, contact the joining surface 16 of the second substrate 15. Subsequently, in the plurality of the joining regions 12a of the first substrate 11, the rolls on the joining regions 12a are repaired by a desired pressurizing force, respectively. Then, the joining regions 12a of the first substrate 11 align with the joining surface 16 of the second substrate 15 so that the space S between the joining surface 12 and the joining surface 16 in the stacked body 10 disappears.

On the other hand, the segmenting groove 18 of the first substrate 11 hardly contacts the joining surface 16 of the second substrate 15. Repairing of the roll on the joining region 12a may cause the deformation (that is, distortion or strain) to occur. However, the deformation in one joining region 12a is unlikely to spread to a neighboring joining regions 12a due to the action of the flexibility at a portion on which the segmenting recess 18 is formed, because the segmenting groove 18 segments the area of the joining surface 12 into small segments and suppress the deformation from occurring. As a result, it is considered that all joining regions 12a can be joined to the joining surface 16 with a smaller pressurizing force that hardly cause the flow channel forming portion 24 to be excessively deformed.

At this moment, it is not necessarily required to repair a space (i.e., roll) that exists between the segmenting groove 18 and the joining surface 16 other than the space S between the joining surface 12 and the joining surface 16. Such space may remain as a gap between the first substrate 11 and the second substrate 15.

It should be noted that when pressing another stacked body constituted with the first substrate without the segmenting recessed portion and the second substrate, in some cases it is impossible to join all of the joining regions 12a appropriately to the joining surface 16 with the above described small pressurizing force that hardly cause the flow channel forming portion 24 to be excessively deformed.

The above difference can be reasoned by the Hertz's contact elastic deformation theory. Generally outlining, when the joining surface is segmented into joining regions each having a smaller area than the joining surface, the flatness in the individual joining region becomes smaller than the flatness of the original joining surface, in other words, the degree of flatness becomes higher. Then, as the flatness becomes smaller, the pressurizing force required to tightly adhere the first substrate to the second substrate for sure becomes smaller. Accordingly, it makes it possible to perform the joining in the individual joining region without the gap being generated while preventing the flow channel forming portion from being excessively deformed.

On the other hand, the flatness in a large-area continuous joining surface that is not segmented by the segmenting recessed portion becomes larger as compared to the case in which the joining surface is segmented into a plurality of joining regions, in other words, the degree of flatness becomes smaller. For this reason, the pressurizing force required to tightly adhere the first substrate to the second substrate for sure becomes larger. Accordingly, the flow channel forming portion is more likely to be deformed because the joining surface has to be pressed with such larger pressurizing force. Here, the flatness means the shortest distance between two hypothetical parallel planes when a target surface (that is, a joining surface or an individual joining region) is sandwiched by the two hypothetical parallel planes.

As described above, as shown in FIG. 1E, it comes to the status in which whole surfaces of the joining surface 12 on the first substrate 11 uniformly contact the joining surface 16 of the second substrate 15. As a result, it makes it possible to avoid any defects, for example, that the defective in joining between the substrates 11 and 15 occurs, that the structural recess 20 serving as the microchannel formed in the substrate 11 is deformed, and that the gas bubbles are caught in the joining boundary 17a between two substrates 11 and 15. Resultantly, it makes it possible to achieve a sufficiently tight adhered state between the first substrate 11 and the second substrate 15 without those defects interfering with the structural recess 20 of the first substrate 11.

Subsequently, the first substrate 11 and the second substrate 15 undergo various chemical reaction processes, for example, are joined to each other by the hydrogen bond between the OH group at the terminal of the joining surface 12 of the first substrate 11 and the OH group at the terminal of the joining surface 16 of the second substrate 16. As a result, a joined body 17 can be obtained in which the first substrate 11 is firmly and integrally joined to the second substrate 15.

According to the above described method of bonding the substrates, the joining surface 12 of the first substrate 11 is constituted with a plurality of joining regions 12a segmented to be separate from one another by the segmenting groove 18. The area of individual joining region 12a is smaller as compared to the case in which the whole surface of the substrate 11 is constituted with one joining surface. Thus, it makes it possible to suppress warpage of the substrate 11 and the roll on the joining surface 12 from affecting the joining. For this reason, when pressurizing in the pressurizing step, it makes it possible to tightly adhere whole surface in each of the joining regions 12a to the joining surface 16 in an assured manner. As a result, whole surface of the joining boundary 17a in the joined body 17 are tightly adhered in an assured manner. Resultantly, it makes it possible to join the first substrate 11 and the second substrate 15 in the higher adhered state even when at least one of the substrate has the warpage of the substrate or the roll on the joining surface thereof.

(Method of Manufacturing Microchip)

A method of manufacturing microchip according to the present embodiment is a method to obtain a microchip having a flow channel in which a medium flows using the above described method of bonding the substrates.

In other words, to be used for a microchip substrate is the first substrate and the second substrate at least one of which has a flow channel forming portion provided on one joining surface thereof.

According to the above described method of manufacturing the microchip, the first substrate 11 and the second substrate 15 are joined to each other using the above described method of bonding the substrates. Thus, it makes it possible to tightly adhere the whole surface of the joining boundary 17a in the obtained joined body (i.e., microchip) 17. Accordingly, the first substrate 11 and the second substrate 15 such as a microchip substrate having a large area, at least one of which may have the warpage of the substrate or the roll on the joining surface thereof, can be joined to each other in the higher adhered state. As a result, it makes it possible to form a desired flow channel with the higher reliability even when the large sized microchip is employed.

(Microchip)

A microchip according to the present embodiment includes a flow channel in which a medium flows, which is obtained by the above mentioned method of manufacturing the microchip.

Figure 1E:
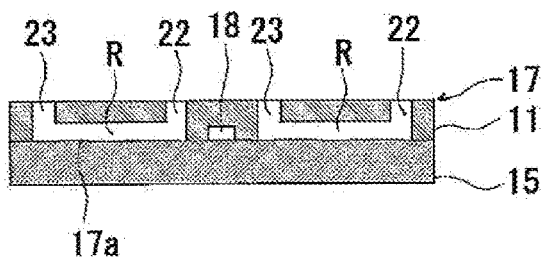
FIG. 1E is a view schematically illustrating the example of a method of bonding substrates according to a present embodiment of the present invention.

More particularly, as shown in FIG. 1E, the microchip is constituted with the joined body 17 in which the first substrate 11 and the second substrate 15 are bonded to each other.

Then, at least one joining surface out of the joining surface 12 of the first substrate 11 and the joining surface 16 of the second substrate 15 (the joining surface 12 of the first substrate 11 in FIGS. 1A to 1E) is constituted or provided with a plurality of joining regions 12a that are segmented to be separated from one other by the segmenting groove 18.

At least one of the joining surfaces 12 and 16 of the first substrate 11 and the second substrate 15 (the joining surface 12 of the first substrate in FIGS. 1A to 1E) is provided with the structural recess 20. The structural recess 20 includes the injection port 22, the discharge port 23, and the flow channel forming portion 24. The flow channel forming portion 24 is, as shown in FIG. 1E, is sealed by the second substrate 15 serving as a lid or cover so as to partition a flow channel R in which the medium flows.

As described above, the present embodiment of the present invention has been described in detail. Nevertheless, the present invention is not limited to those described as the present embodiment and various modifications can be conceived.

For example, the present invention is not limited to the configuration in which the structural recess 20 is formed in the joining regions 12a constituting the joining surface 12 of the first substrate 11, as the joined body 17 shown in FIGS. 1A to 1E and FIG. 2. Alternatively, the structural recess may be formed on the joining surface that constitutes one continuous plane of the second substrate 15. In this case, a joining region is arranged on the opposing first substrate configured to seal the structural recess formed on the joining surface of the second substrate at a position corresponding thereto.

Yet alternatively, the structural recesses may be formed on both of the first substrate 11 and the second substrate 15.

Yet also, for example, the joining surface constituted with a plurality of joining regions, which are segmented by the segmenting groove 18, may be provided on either of the first substrate 11 or the second substrate 15. Nevertheless, alternatively, the joining surfaces may be provided on both substrates 11 and 15. In this case, the microchip has a configuration in which the joining regions 12a constituting the joining surface 12 of the first substrate 11 correspond to and contact the joining regions of the joining surface 16 of the second substrate 15. In such configuration, both of the first substrate 11 and the second substrate 15 preferably have the flexibility so that the joining surfaces are more likely to contact each other.

Figure 4A:
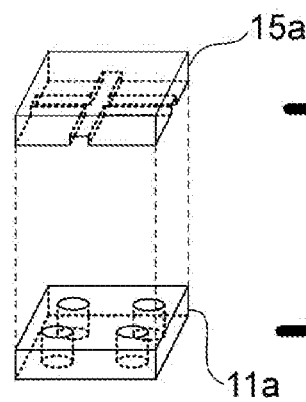
FIG. 4A is a perspective view illustrating another example of the first substrate and the second substrate in which a groove is provided at the second substrate side.
Figure 4B:
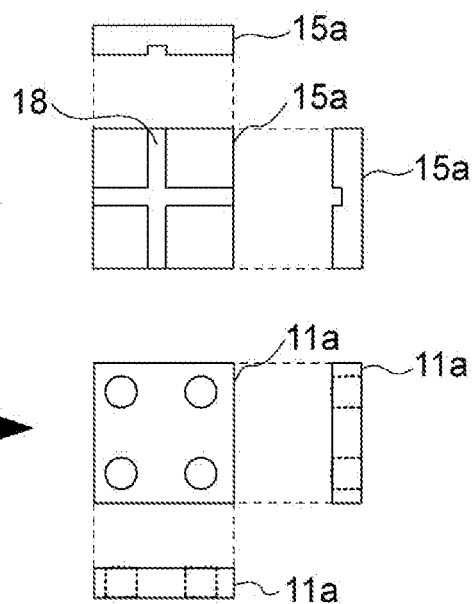
FIG. 4B is a view illustrating another example of the first substrate and the second substrate in which the groove is provided at the second substrate side.

FIGS. 4A and 4B are views illustrating one modification to the present embodiment in which a segmenting grove 18 is formed on the joining surface of the second substrate 15a instead of the first substrate 11a.

Yet alternatively, for example, the segmenting groove 18 may be formed on an opposite surface to the joining surface 12 of the first substrate 11 and/or an opposite surface to the joining surface 16 of the second substrate 15. In this case, the joining surfaces of the substrates are easier to contact each other because the wall thickness at the portion of the segmenting groove 18 becomes thinner regardless of the orientation of the segmenting groove 18.

Figure 5A:
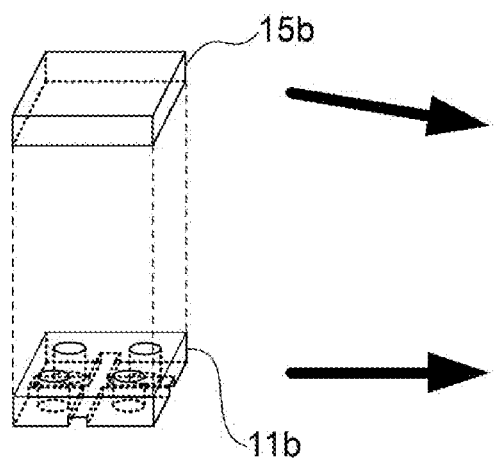
FIG. 5A is a perspective view illustrating yet another example of the first substrate and the second substrate in which a groove is provided at an opposite side of a joining surface of the first substrate.
Figure 5B:
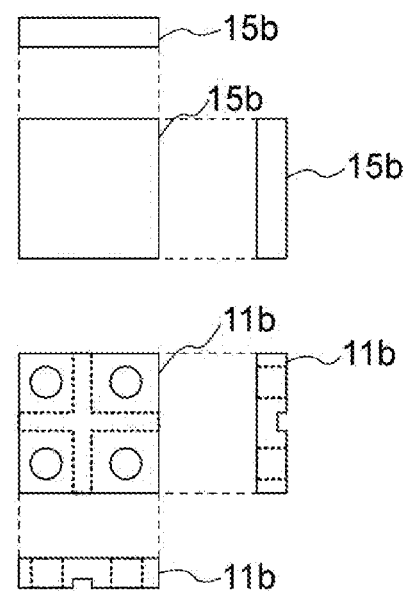
FIG. 5B is a view illustrating yet another example of the first substrate and the second substrate in which the groove is provided at the opposite side of the joining surface of the first substrate.

FIGS. 5A and 5B are view illustrating another modification to the present embodiment in which a segment groove 18 is formed on the opposite surface of the first substrate 11b instead of the second substrate 15b.

Figure 6A:
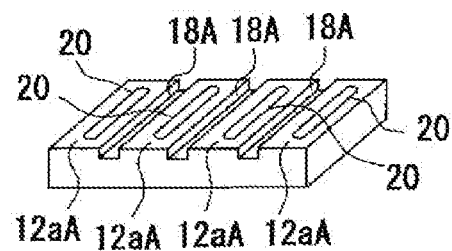
FIG. 6A is a perspective view illustrating another example of joining regions of the first substrate.

Yet also, for example, the shape of the joining regions may be, as shown in FIG. 6A, joining regions 12aA each having an elongated rectangular shape when viewed in a plan view. The joining regions 12aA are segmented by a segmenting groove 18A that is a segmenting recessed portion solely consisting of a gutter shaped groove.

Figure 6B:
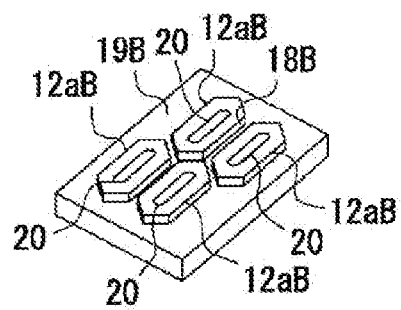
FIG. 6B is a perspective view illustrating yet another example of the joining regions of the first substrate.

Alternatively, the shape of the joining regions may be, as shown in FIG. 6B, joining regions 12aB each having an elongated hexagonal shape when viewed in a plan view. The joining regions 12aB are segmented by a segmenting groove 18B that is a segmenting recessed portion having a shape in which gutter shaped grooves are combined in a Y-shape, and also surrounded by a peripheral recessed portion 19B that is a segmenting recessed portion continuous to the segmenting groove 18B.

Figure 6C:
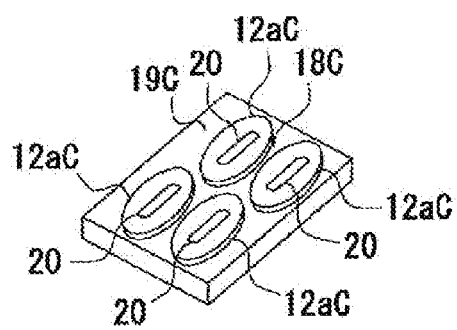
FIG. 6C is a perspective view illustrating yet another example of the joining regions of the first substrate.

Yet alternatively, the shape of the joining regions may be, as shown in FIG. 6C, joining regions 12aC each having an elliptical shape when viewed in a plan view. In FIG. 6C, 18C denotes a segmenting groove serving as the segmenting recessed portion, and 19C denotes a peripheral recess serving as the segmenting recessed portion, which surrounds the joining regions 12aC.

It should be noted that, in FIGS. 6A to 6C, a reference numeral 20 denotes a structural recess.

The peripheral recesses 19B and 19C maybe formed by, for example, injection molding a substrate in a flat plate shape.

As a further modifications to the present embodiment, the present embodiment is not limited to the joining of a plate-like members but also applicable to the bonding of base members having a three dimensional shape such as an optical component or the like.

FIGS. 13A to 13E are views illustrating another modification to the present embodiment in which a prism is fixed to a base member as an exemplary base material having an optically three dimensional shape.

Referring to FIGS. 13A to 13E, a base member 71 has an elongated shape in the longitudinal direction of the prism 72. The base member 71 is provided with a flat surface on an upper face of a stepwise convex portion thereof.

Furthermore, the base member 71 is provided with a groove 73 on the upper surface of the stepwise convex portion thereof. A bottom face of the prism 72 is caused to face and joined to the upper face with the groove 73 of the base member 71 so that the prism 72 is capable of being tightly adhered to the base member 71.

Figure 14A:
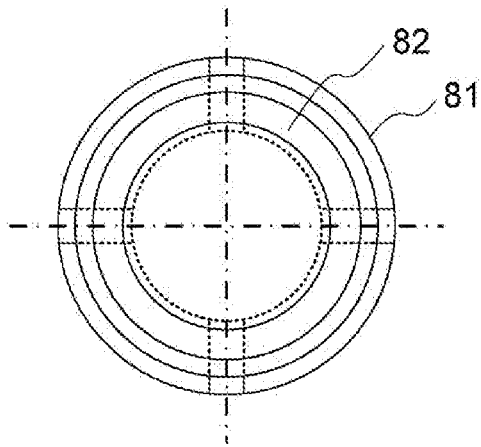
FIG. 14A is a view illustrating another modification to the present embodiment in which the method of bonding is applied for joining a lens to a cylinder.
Figure 14B:
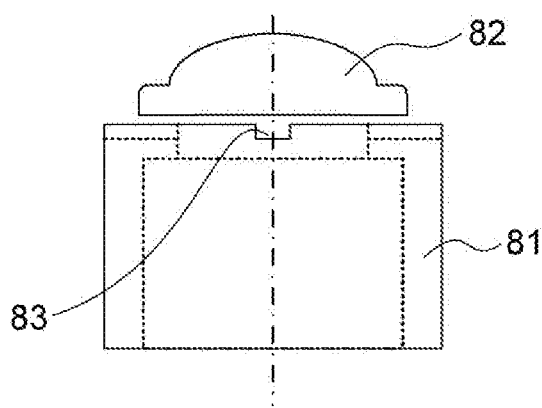
FIG. 14B is a view illustrating another modification to the present embodiment in which the method of bonding is applied for joining the lens to the cylinder.
Figure 14C:
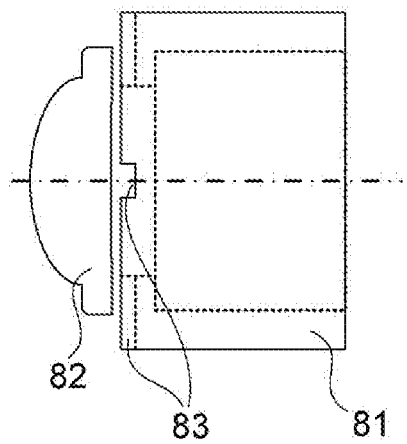
FIG. 14C is a view illustrating another modification to the present embodiment in which the method of bonding is applied for joining the lens to the cylinder.

FIGS. 14A to 14C are views illustrating yet another modification to the present embodiment in which a lens is fixed to an end of a cylinder as another exemplary base material having an optically three dimensional shape.

Referring to FIGS. 14A to 14C, a cylinder 81 is provided with a flat surface that mounts the lens 82 on one end of the cylinder 81.

Furthermore, the cylinder 81 is provided with a groove 83 on the flat surface thereof. A bottom face of the lens 82 is caused to face and joined to the flat surface with the groove 83 of the cylinder 81 so that the lens 82 is capable of being tightly adhered to the cylinder 81.

According to those modifications to the present embodiment, it makes it possible to suppress the warpage of the base material or the roll on the joining face from adversely affecting the joining or bonding. As a result, it makes it possible to allow the whole surface of each of the joining regions to tightly adhere to opposing base material when being pressurized in the pressurizing step.

Working Examples

Hereinafter, working examples of the method of bonding substrates according to the present embodiment will be described in detail below. Nevertheless, it should be noted that the present invention is not limited to the following working examples.

Working Example 1

The first substrate and the second substrate were prepared as follows.

Figure 7:
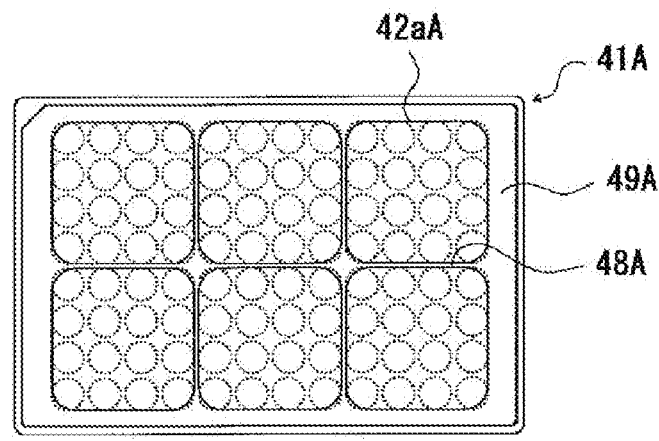
FIG. 7 is a plan view illustrating a first substrate according to a first working example of the present embodiment.

FIG. 7 is a view illustrating the first substrate prepared according to the working example 1. A first substrate 41A has a profile conforming to the SBS standard (i.e., 85 mm×128 mm). On one face of a plate having the thickness of 2 mm and made of the cycloolefin resin ("ZEONEX 460R" manufactured by ZEON Corporation), a peripheral recessed portion 49A and a segmenting groove 48A are formed by the injection molding. The peripheral recessed portion 49A and the segmenting groove 48A are formed such that six rectangular joining regions 42aA, each having a profile of 36 mm×36 mm, are residually arranged as convex portions in two lines and three columns in parallel longitudinally and transversely.

The segmenting groove 48A has the width of 2 mm and the depth (that is, the distance from the joining regions 42aA to the innermost portion of the segmenting groove 48A) of 1 mm. Likewise, the peripheral recessed portion 49A also has the depth (that is, the distance from the joining regions 42aA to the innermost portion of the peripheral recess 49A) of 1 mm.

A second substrate has a profile conforming to the SBS standard (i.e., 85 mm×128 mm). The second substrate is a microplate with 12×8 holes on which structural recesses are formed on a joining face of a plate having the thickness of 2 mm and made of the cycloolefin resin ("ZEONEX 460R" manufactured by ZEON Corporation). A plurality of holes of the microplate, which serve as the structural recesses, respectively, are independent of one another. In this regard, although it does not have a so-called microchip structure in which two holes are coupled to each other through a flow channel, it is assumed that each of the holes of the microplate is to be the injection port and the discharge port of the microchip so as to perform the bonding. It is also assumed that the hole to be serve as the structural recess of the respective holes of the microplate is opposed to the same joining region 42aA on the opposing first substrate. In FIG. 7, the chained line denotes the positon of the hole in the second substrate corresponding to the first substrate 41A.

The above prepared first substrate 41A and the second substrate were bonded to each other by performing the following ultra violet light irradiation step and the joining step.

(Ultra Violet Light Irradiation Step)

Using a xenon excimer lamp, respective joining surfaces of the two substrates were irradiated with the vacuum ultra violet light under the condition of the illuminance of 40 mW/cm$^2$ and the irradiation time of 20 seconds.

(Joining Step)

The two substrates were stacked such that respective joining surfaces thereof contact each other so as to obtain a stacked body (Stacking Step). Subsequently, the stacked body were pressurized under the condition of the pressure of 0.2 MPa, the pressurizing time of 300 seconds, and the heating temperature of 90 degrees Celsius so as to join the two substrates, and resultantly a joined body [A] was obtained.

Working Example 2

Two substrates were joined and the joined body [B] were obtained similarly to the working example 1, except that the first substrate was prepared as follows.

Figure 8:
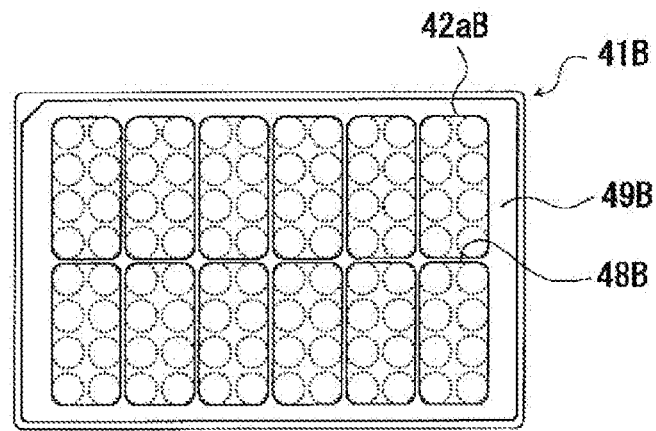
FIG. 8 is a plan view illustrating a first substrate according to a second working example of the present embodiment.

FIG. 8 is a view illustrating the first substrate prepared according to the working example 2. A first substrate 41B has a profile conforming to the SBS standard (i.e., 85 mm×128 mm). On one face of a plate having the thickness of 2 mm and made of the cycloolefin resin ("ZEONEX 460R" manufactured by ZEON Corporation), a peripheral recessed portion 49B and a segmenting groove 48B are formed by the injection molding. The peripheral recessed portion 49B and the segmenting groove 48B are formed such that twelve elongated rectangular joining regions 42aB, each having a profile of 18 mm×36 mm, are residually arranged as convex portions in two lines and six columns in parallel longitudinally and transversely.

The segmenting groove 48B has the width of 2 mm and the depth (that is, the distance from the joining regions 42aB to the innermost portion of the segmenting groove 48B) of 1 mm. Likewise, the peripheral recessed portion 49B also has the depth (that is, the distance from the joining regions 42aB to the innermost portion of the peripheral recessed portion 49B) of 1 mm.

Working Example 3

Two substrates were joined and the joined body [C] were obtained similarly to the working example 1, except that the first substrate was prepared as follows.

Figure 9:
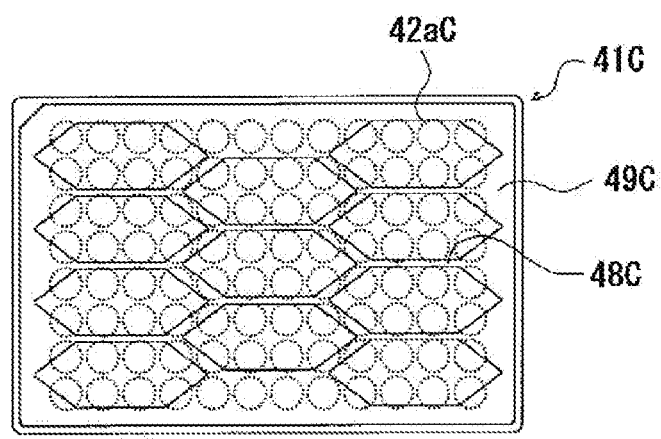
FIG. 9 is a plan view illustrating a first substrate according to a third working example of the present embodiment.

FIG. 9 is a view illustrating the first substrate prepared according to the working example 3. A first substrate 41C has a profile conforming to the SBS standard (i.e., 85 mm×128 mm). On one face of a plate having the thickness of 2 mm and made of the cycloolefin resin ("ZEONEX 460R" manufactured by ZEON Corporation), a peripheral recessed portion 49C and a segmenting groove 48C are formed by the injection molding. The peripheral recessed portion 49C and the segmenting groove 48C are formed such that eleven elongated hexagonal joining regions 42aC, each having a long side of 43 mm and a short side of 18 mm, are residually arranged as convex portions in four, three, and four in three columns, respectively.

The segmenting groove 48C has the width of 2 mm at the narrowest portion and the depth (that is, the distance from the joining regions 42aC to the innermost portion of the segmenting groove 48C) of 1 mm. Likewise, the peripheral recessed portion 49C also has the depth (that is, the distance from the joining regions 42aC to the innermost portion of the peripheral recessed portion 49C) of 1 mm.

Working Example 4

Two substrates were joined and the joined body [D] were obtained similarly to the working example 1, except that the first substrate was prepared as follows.

Figure 10:
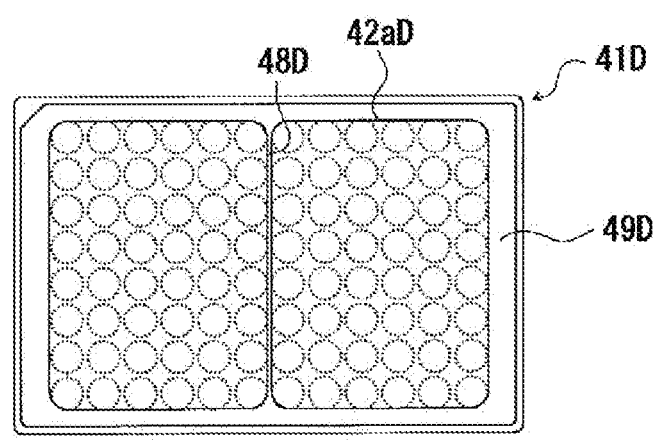
FIG. 10 is a plan view illustrating a first substrate according to a fourth working example of the present embodiment.

FIG. 10 is a view illustrating the first substrate prepared according to the working example 4. A first substrate 41D has a profile conforming to the SBS standard (i.e., 85 mm×128 mm). On one face of a plate having the thickness of 2 mm and made of the cycloolefin resin ("ZEONEX 460R" manufactured by ZEON Corporation), a peripheral recessed portion 49D and a segmenting groove 48D are formed by the injection molding. The peripheral recessed portion 49D and the segmenting groove 48D are formed such that two rectangular joining regions 42aD, each having a profile of 54 mm×72 mm, are residually arranged as convex portions.

The segmenting groove 48D has the width of 2 mm and the depth (that is, the distance from the joining regions 42aD to the innermost portion of the segmenting groove 48D) of 1 mm. Likewise, the peripheral recessed portion 49D also has the depth (that is, the distance from the joining regions 42aD to the innermost portion of the peripheral recess 49D) of 1 mm.

Comparative Example 4

Two substrates were joined and the joined body [E] were obtained similarly to the working example 1, except that the first substrate was prepared as follows.

Figure 11:
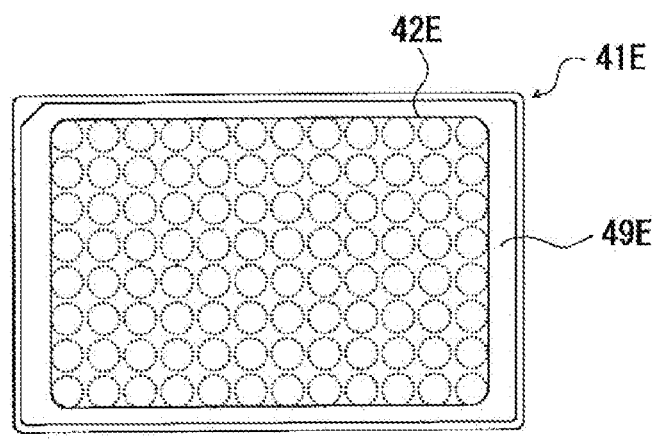
FIG. 11 is a plan view illustrating a first substrate according to a first comparative example.
Figure 12A:
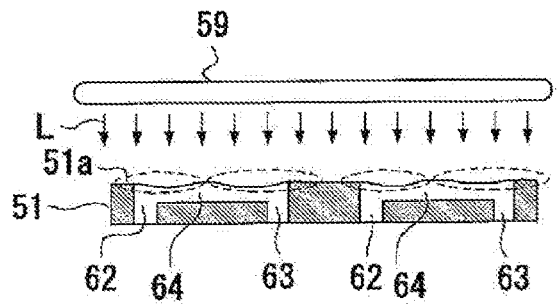
FIG. 12A is a view schematically illustrating an example of a conventional method of manufacturing a microchip.
Figure 12B:
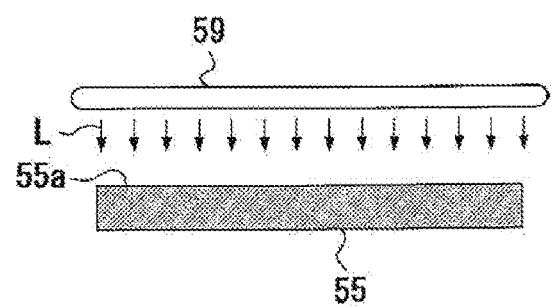
FIG. 12B is a view schematically illustrating the example of the convention method of manufacturing the microchip.
Figure 12C:
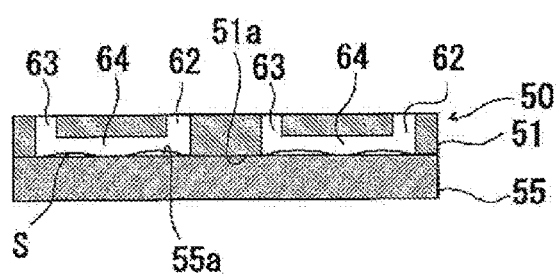
FIG. 12C is a view schematically illustrating the example of the conventional method of manufacturing the microchip.
Figure 12D:
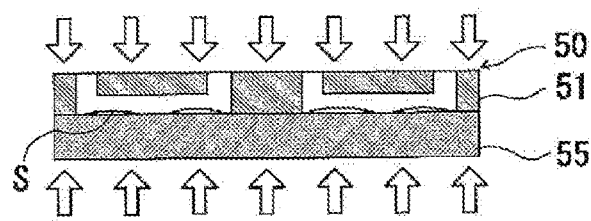
FIG. 12D is a view schematically illustrating the example of the conventional method of manufacturing the microchip.
Figure 12E:
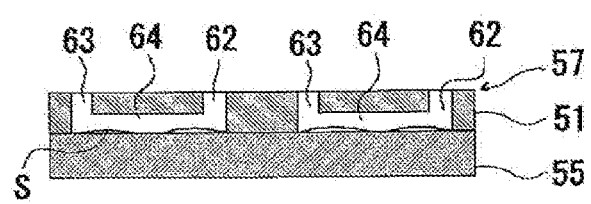
FIG. 12E is a view schematically illustrating the example of the conventional method of manufacturing the microchip.
Figure 13A:
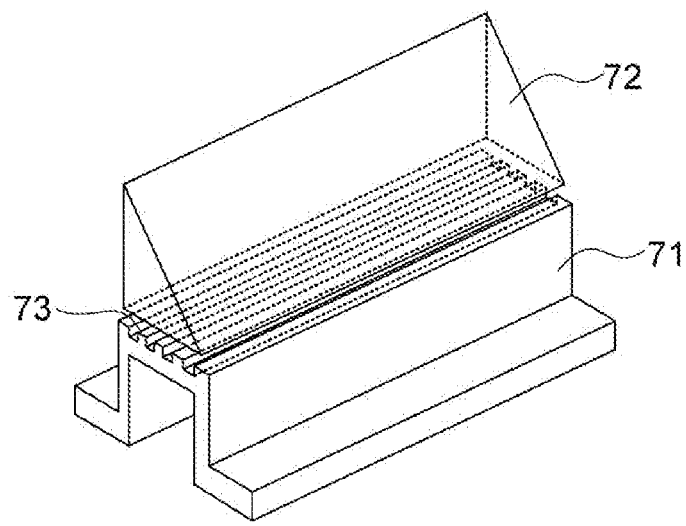
FIG. 13A is a perspective view illustrating a modification to the present embodiment in which the method of bonding is applied for joining a prism to a base.
Figure 13B:
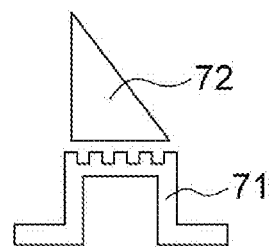
FIG. 13B is a view illustrating the modification to the present embodiment in which the method of bonding is applied for joining the prism to the base.
Figure 13C:
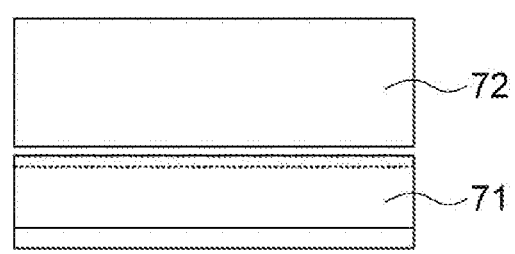
FIG. 13C is a view illustrating the modification to the present embodiment in which the method of bonding is applied for joining the prism to the base.
Figure 13D:
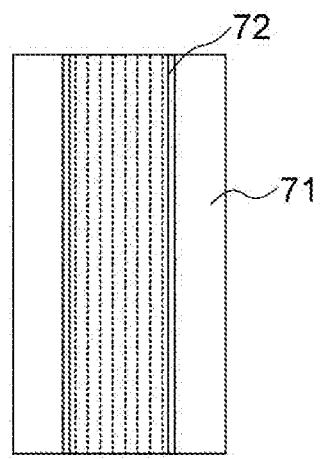
FIG. 13D is a view illustrating the modification to the present embodiment in which the method of bonding is applied for joining the prism to the base.
Figure 13E:
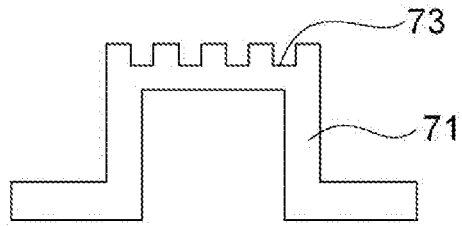
FIG. 13E is a view illustrating the modification to the present embodiment in which the method of bonding is applied for joining the prism to the base.

FIG. 11 is a view illustrating the first substrate prepared according to the comparative example 1. A first substrate 41E has a profile conforming to the SBS standard (i.e., 85 mm×128 mm). On one face of a plate having the thickness of 2 mm and made of the cycloolefin resin ("ZEONEX 460R" manufactured by ZEON Corporation), a peripheral recessed portion 49E is formed by the injection molding. The peripheral recessed portion 49E is formed such that one rectangular joining region 42E having a profile of 106 mm×72 mm is residually arranged as convex portions.

The peripheral recessed portion 49E has the depth (that is, the distance from the joining regions 42E to the innermost portion of the peripheral recess 49E) of 1 mm.

A joining statuses of the joined bodies [A] to [E] were evaluated, respectively, as follows. Table 1 illustrates the results evaluated.

More particularly, when the first substrate and the second substrate are joined to each other, both substrates are unified or integrated, thus a portion that is tightly joined without a gap becomes to be without a boundary face or interfacial surface. On the other hand, the boundary face remains at a portion that is not joined. For this reason, when a planar photograph is taken from the second substrate side, then the portion at which the boundary face remains can be observed as a dark portion in the photographed image.

Accordingly, in evaluating the joining statuses of the joined bodies [A] to [E], the planar photographs of the joined bodies [A] to [E] were taken, respectively, from the second substrate side, areas of the portions that are not joined in the photographed images were calculated, respectively, using an image measurement software, and ratios of the joined area actually joined with respect to the entire areas to be joined (i.e., theoretical values) were obtained, respectively.

It can be assumed that, when the ratio of the joined area is equal to or greater than 80%, a joined body is endurable to a practical use.

TABLE 1

|  | Segmented Joining Surfaces of First Substrate | | Evaluation Result | |
| --- | --- | --- | --- | --- |
|  | Number | Shape | Ratio of Joined Area | Evaluation |
| Working Example 1 | 6 | FIG. 7 | 100% | Excellent |
| Working Example 2 | 12 | FIG. 8 | 100% | Excellent |
| Working Example 3 | 11 | FIG. 9 | 100% | Excellent |
| Working Example 4 | 2 | FIG. 10 | 83% | Acceptable |
| Comparative Example 1 | 1 | FIG. 11 | 68% | No good |

As apparent from the above table 1, in the joined bodies according to the working examples 1 to 4, in which the joining face of the first substrate was constituted with a plurality of joining regions that were segmented to be separate from one another by the segmenting recessed portion such as the segmenting groove, it was confirmed that the whole surface of the boundary face of the joined body were tightly adhered to the second substrate. As a result, it was confirmed that the first substrate and the second substrate would be capable of being joined to each other in a higher adhered state, even when at least one of the substrates would have the warpage of the substrate or the roll on the joining surface thereof.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and changes in the form of the apparatuses and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2016-225765, filed on Nov. 21, 2016, and the entire contents of which are incorporated herein by reference.

REFERENCE SIGNS LIST

10: Stacked Body
11: First Substrate
12: Joining Surface
12a; 12aA; 12aB; 12aC: Joining Region
15: Second Substrate
16: Joining Surface
17: Joined Body
17a: Joining Boundary
18; 18A; 18B; 18C: Segmenting Groove
19B; 19C: Peripheral Recessed Portion
20: Structural Recess
22: Injection Port 23: Discharge Port
24: Flow Channel Forming Portion
30: Ultra Violet Light Source
41A; 41B; 41C; 41D; 41E: First Substrate
42aA; 42aB; 42aC; 42aD: Joining Region
42E: Joining Surface
48A; 48B; 48C; 48D: Segmenting Groove
49A; 49B; 49C; 49D; 49E: Peripheral Recessed Portion
50: Stacked Body
51: First Microchip Substrate
51a: Joining Surface
55: Second Microchip Substrate
55a: Joining Surface
57: Joined Body
59: Ultra Violet Light Source
62: Injection Port
63: Discharge Port
64: Flow Channel Forming Portion
L: Vacuum Ultra Violet Light
R: Flow Channel
S: Space

What is claimed is:

1. A microchip having a flow channel in which a medium flows, the microchip comprising:
a first substrate and a second substrate bonded directly to each other without any adhesive agent intervening or a solvent bonded interface between the substrates, each of the first substrate and the second substrate being made of glass or a resin;
a plurality of joining regions provided on at least one of a joining surface of the first substrate and a joining surface of the second substrate;
a plurality of flow channel forming portions each arranged within at least one of the plurality of joining regions and configured to form a flow channel in which a medium flows during use; and
a segmenting recessed portion arranged to extend at least longitudinally or transversely to an edge of the first substrate or the second substrate to segment the joining surface of the first substrate or the second substrate into the plurality of joining regions to be separate from one another,
wherein the segmenting recessed portion is not in fluid contact with the plurality of flow channel forming portions.

2. The microchip according to claim 1, wherein, where t denotes a thickness of the first and/or second substrate having the segmenting recessed portion, d denotes an upper limit of a depth of the segmenting recessed portion from the joining surface of the first and/or second substrate, and $d_{min}$ denotes a lower limit of the depth d of the segmenting recessed portion from the joining surface, where $d_{min}$ has a value greater than 50 μm and satisfies a following formula (1)

$$0.7t \geq d \geq d_{min} > 0.05t \qquad \text{formula (1)}.$$

3. The microchip according to claim 1, wherein the segmenting recessed portion has a gutter shape and open to the joining surface of the first substrate and/or a side periphery of the second substrate.

4. The microchip according to claim 1, wherein the segmenting recessed portion communicates with a peripheral recessed portion provided at a periphery of the joining surface of the first substrate and/or a periphery of the second substrate.

5. The microchip according to claim 2, wherein the segmenting recessed portion is constituted with a groove, and, where w denotes a width of the groove, w satisfies a following formula (2)

$$w \geq t \qquad \text{formula (2)}.$$

6. The microchip according to claim 2, wherein the segmenting recessed portion has a gutter shape and is open to the joining surface of the first substrate and/or a side periphery of the second substrate.

7. The microchip according to claim 5, wherein the segmenting recessed portion has a gutter shape and is open to the joining surface of the first substrate and/or a side periphery of the second substrate.

8. The microchip according to claim 2, wherein the segmenting recessed portion communicates with a peripheral recessed portion provided at a periphery of the joining surface of the first substrate and/or a periphery of the second substrate.

9. The microchip according to claim 5, wherein the segmenting recessed portion communicates with a peripheral recessed portion provided at a periphery of the joining surface of the first substrate and/or a periphery of the second substrate.

10. A microchip having a flow channel in which a medium flows, the microchip comprising:
a first substrate and a second substrate bonded directly to each other without any adhesive agent intervening or a solvent bonded interface between the substrates, each of the first substrate and the second substrate being made of glass or a resin;
a plurality of joining regions provided on at least one of a joining surface of the first substrate and a joining surface of the second substrate;
a plurality of flow channel forming portions each arranged within at least one of the plurality of joining regions and configured to form a flow channel in which a medium flows during use; and
a segmenting groove arranged to extend at least longitudinally or transversely to an edge of the first substrate or the second substrate to segment a surface opposite to the joining surface of the first substrate or the second substrate into the plurality of regions to be separate from one another,
wherein the segmenting groove is not in fluid contact with the plurality of flow channel forming portions.

* * * * *